(12) United States Patent
Subrahmanya et al.

(10) Patent No.: US 8,667,454 B1
(45) Date of Patent: Mar. 4, 2014

(54) SYSTEM, METHOD, AND COMPUTER PROGRAM PRODUCT FOR OPTIMIZING PINS

(75) Inventors: Narasimha Murthy Palla Subrahmanya, Secunderabad (IN); Srinivasa Ravi Vedula, Hyderabad (IN); Nishitkumar Manharbhai Patel, Dlst-Kheda (IN); Nagesh C. Gupta, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/160,992

(22) Filed: Jun. 15, 2011

(51) Int. Cl.
*G06F 17/50* (2006.01)

(52) U.S. Cl.
USPC .......................................................... 716/137

(58) Field of Classification Search
USPC .................................................. 716/100, 137
See application file for complete search history.

(56) References Cited

U.S. PATENT DOCUMENTS

| | | | | |
|---|---|---|---|---|
| 5,729,467 A | * | 3/1998 | Katsumata et al. | 716/129 |
| 6,256,769 B1 | * | 7/2001 | Tamarkin et al. | 716/126 |
| 6,566,761 B1 | * | 5/2003 | Sharma et al. | 257/778 |
| 6,654,941 B1 | * | 11/2003 | Baumbach | 716/113 |
| 7,398,500 B1 | | 7/2008 | Gupta et al. | |
| 7,562,331 B2 | | 7/2009 | Gupta et al. | |
| 7,937,681 B2 | * | 5/2011 | Wadland et al. | 716/129 |
| 8,386,982 B1 | * | 2/2013 | Mishra et al. | 716/124 |
| 2001/0003843 A1 | * | 6/2001 | Scepanovic et al. | 716/7 |
| 2003/0222872 A1 | * | 12/2003 | Lin et al. | 345/440 |
| 2005/0022149 A1 | * | 1/2005 | Smith et al. | 716/15 |
| 2006/0242614 A1 | * | 10/2006 | Wadland et al. | 716/12 |
| 2008/0250373 A1 | * | 10/2008 | Bird et al. | 716/7 |
| 2008/0250378 A1 | * | 10/2008 | Chen et al. | 716/16 |
| 2009/0178017 A1 | | 7/2009 | Gupta et al. | |
| 2010/0270681 A1 | * | 10/2010 | Bird et al. | 257/773 |

OTHER PUBLICATIONS

Cadence Design Systems, Inc., "Cadence Allegro PCB Design: Placement, Routing and Manufacturing Prep," Cadence Allegro FPGA System Planner, 2009, pp. 1-9.
Cadence Design Systems, Inc., "Allegro FPGA System Planner," 2009, pp. 1-9.

* cited by examiner

*Primary Examiner* — Suchin Parihar
(74) *Attorney, Agent, or Firm* — Holland & Knight LLP; Mark H. Whittenberger, Esq.

(57) ABSTRACT

The present disclosure relates to a computer-implemented method for synthesis of device I/O associated with a printed circuit board (PCB) design. The method may include generating a first programmable device model and a second device model. The method may further include determining one or more pin assignments associated with the first programmable device model and the second device model based upon, at least in part, one or more of a breakout pattern, a breakout location and a fanout location, the one or more pin assignments configured to minimize one or more crossovers.

15 Claims, 21 Drawing Sheets

2100 generating a first programmable device model and a second programmable device model

2102 determining one or more pin assignments associated with the first and second programmable device models based upon, at least in part, one or more of a breakout pattern and a fanout location, the one or more pin assignments configured to minimize one or more crossovers

2104

SYSTEM, METHOD, AND COMPUTER PROGRAM PRODUCT FOR OPTIMIZING PINS

FIELD OF THE INVENTION

The present disclosure relates to synthesis of programmable device designs, and more specifically, to synthesis of field-programmable gate array (FPGAs) associated with a printed circuit board (PCB) design.

DISCUSSION OF THE RELATED ART

A printed circuit board (PCB) provides a surface to mount and interconnect electronic components. In general, a PCB consists of an insulating sheet onto which conductive paths are printed. The insulating sheet, also referred to as the substrate, is often composed of fiberglass-reinforced epoxy composite. The printed conductive paths, also referred to as traces, are often composed of copper. After the PCB has been manufactured, electronic components are mounted on the substrate and attached to the traces usually by soldering. As PCBs are rugged, inexpensive, and highly reliable, they are used extensively in many types of electronic equipment and systems.

There are many different types of electronic components that can be mounted and interconnected using a PCB. Examples of such electronic components include memory chips, transistors, resistors, processor chips, and programmable devices such as an FPGA. An FPGA is a large-scale integrated circuit that can be programmed and re-programmed after it is manufactured. Thus, an FPGA is an example of an electronic component that is not limited to a predetermined, unchangeable hardware function.

A pin often serves as a connection point to an electronic component. In other words, when connecting two electronic components together, it is a pin of the first electronic component that is being connected (e.g., via a copper trace) to a pin of the second electronic component. An electronic component may have any number of pins. Some electronic components have fewer than a dozen pins, while other electronic components, an FPGA for example, may have over 1,000 pins.

Each pin of an electrical component has both an electrical definition and a logical definition that must be observed when connecting the pin. The electrical definition indicates voltage ranges, current ranges, frequency ranges, rise times, fall times and other electrical properties well known in the art under which the pin and portion of the electronic component associated with the pin are designed to operate. Failure to observe an electrical definition may result in undesirable performance and even damage to the electronic component. The logical definition of a pin indicates the function of the pin. For example, the pin may be a signal input pin, a signal output pin, a data pin, an address pin, a clock input pin, a power pin, a configure pin, or another type of pin well known in the art. Pins may be connected based on both the electrical definition and the logical definition. Clearly, a signal input pin on a first electronic component should not be connected to a signal input pin on a second electronic component. Likewise, a pin restricted to an operating frequency of less than 10 MHz should not be connected to a pin that outputs or requires a signal with a frequency exceeding 200 MHz.

FPGA IPs (Intellectual Property Blocks) are predefined complex functions and circuits that have been tested and optimized to speed up the design process and to simplify the design of complex systems in FPGAs. Use of pre-validated IPs makes design time shorter and reduces the risk as well as the associated unknowns in a particular design.

Some existing software tools (e.g. FPGA System Planner (FSP)), include a built-in knowledge of FPGA design rule check (DRC) and the ability to optimize FPGA pinouts, thus assisting in bridging the gap between RTL designs and the PCB design. Moreover, FSP may be configured to perform placement aware synthesis and minimize crossovers on the existing "rats nest" type of design.

Unfortunately, optimization on the "rats nest" does not always guarantee an improvement in the routing due to fanout and breakout directions/patterns, obstructions on the PCB, etc. Failing to consider breakout/fanout patterns may result in sub-optimal designs, inefficient use of design resources and increased number of design iterations to achieve convergence.

SUMMARY OF INVENTION

In one or more embodiments of the present disclosure, a computer-implemented method for synthesis of device I/O associated with a printed circuit board (PCB) design is provided. In some embodiments the method may include generating a first programmable device model and a second device model. The method may further include determining one or more pin assignments associated with the first programmable device model and the second device model based upon, at least in part, one or more of a breakout pattern and a fanout location, the one or more pin assignments configured to minimize one or more crossovers.

One or more of the following features may be included. In some embodiments, determining may be based upon, at least in part, an assigned PCB layer. In some embodiments, the method may further include automatically assigning one or more bundles to a preferred PCB layer based upon, at least in part, an overall PCB layer congestion level. In some embodiments, the method may also include performing I/O synthesis based upon at least one virtual location, the at least one virtual location corresponding to at least one of a pin and a component. In some embodiments, the method may additionally include automatic bundling one or more nets based upon, at least in part, at least one of an electrical constraint, a logical constraint, and a physical constraint. In some embodiments, the method may further include performing one or more of a rotation and a shift of a virtual component on the PCB board based upon, at least in part, an expected breakout direction. In some embodiments, the method may also include automatically determining a breakout direction of a bundle based upon, at least in part, at least one of a component placement and a pin placement. In some embodiments, the method may also include automatically determining a minimum number of layers on which the PCB is routed.

In one or more embodiments of the present disclosure, a system for synthesis of device I/O associated with a printed circuit board (PCB) design is provided. In some embodiments, the system may include a computing device having at least one processor configured to generate a first programmable device model and a second device model. In some embodiments, the at least one processor may be further configured to determine one or more pin assignments associated with the first programmable device model and the second device model based upon, at least in part, one or more of a breakout pattern and a fanout location, the one or more pin assignments configured to minimize one or more crossovers.

One or more of the following features may be included. In some embodiments, the system may be configured to determine may be based upon, at least in part, an assigned PCB layer. In some embodiments, the system may be configured to automatically assign one or more bundles to a preferred PCB layer based upon, at least in part, an overall PCB layer congestion level. In some embodiments, the system may be configured to perform I/O synthesis based upon at least one virtual location, the at least one virtual location corresponding to at least one of a pin and a component. In some embodiments, the system may be configured to automatic bundle one or more nets based upon, at least in part, at least one of an electrical constraint, a logical constraint, and a physical constraint. In some embodiments, the system may be configured to perform one or more of a rotation and a shift of a virtual component on the PCB board based upon, at least in part, an expected breakout direction. In some embodiments, the system may be configured to automatically determine a breakout direction of a bundle based upon, at least in part, at least one of a component placement and a pin placement. In some embodiments, the system may be configured to automatically determine a minimum number of layers on which the PCB is routed.

In one or more embodiments of the present disclosure, a computer-readable storage medium for synthesis of device I/O associated with a printed circuit board (PCB) design is provided. The computer-readable storage medium may have stored thereon instructions that when executed by a machine result in a number of operations. Some operations may include generating a first programmable device model and a second device model. The method may further include determining one or more pin assignments associated with the first programmable device model and the second device model based upon, at least in part, one or more of a breakout pattern and a fanout location, the one or more pin assignments configured to minimize one or more crossovers.

One or more of the following features may be included. In some embodiments, determining may be based upon, at least in part, an assigned PCB layer. In some embodiments, the method may further include automatically assigning one or more bundles to a preferred PCB layer based upon, at least in part, an overall PCB layer congestion level. In some embodiments, the method may also include performing I/O synthesis based upon at least one virtual location, the at least one virtual location corresponding to at least one of a pin and a component. In some embodiments, the method may additionally include automatic bundling one or more nets based upon, at least in part, at least one of an electrical constraint, a logical constraint, and a physical constraint. In some embodiments, the method may further include performing one or more of a rotation and a shift of a virtual component on the PCB board based upon, at least in part, an expected breakout direction. In some embodiments, the method may also include automatically determining a breakout direction of a bundle based upon, at least in part, at least one of a component placement and a pin placement. In some embodiments, the method may also include automatically determining a minimum number of layers on which the PCB is routed.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 9 is a diagram depicting aspects of the design synthesis process in accordance with an embodiment of the present disclosure;

DETAILED DESCRIPTION

Figure 1:
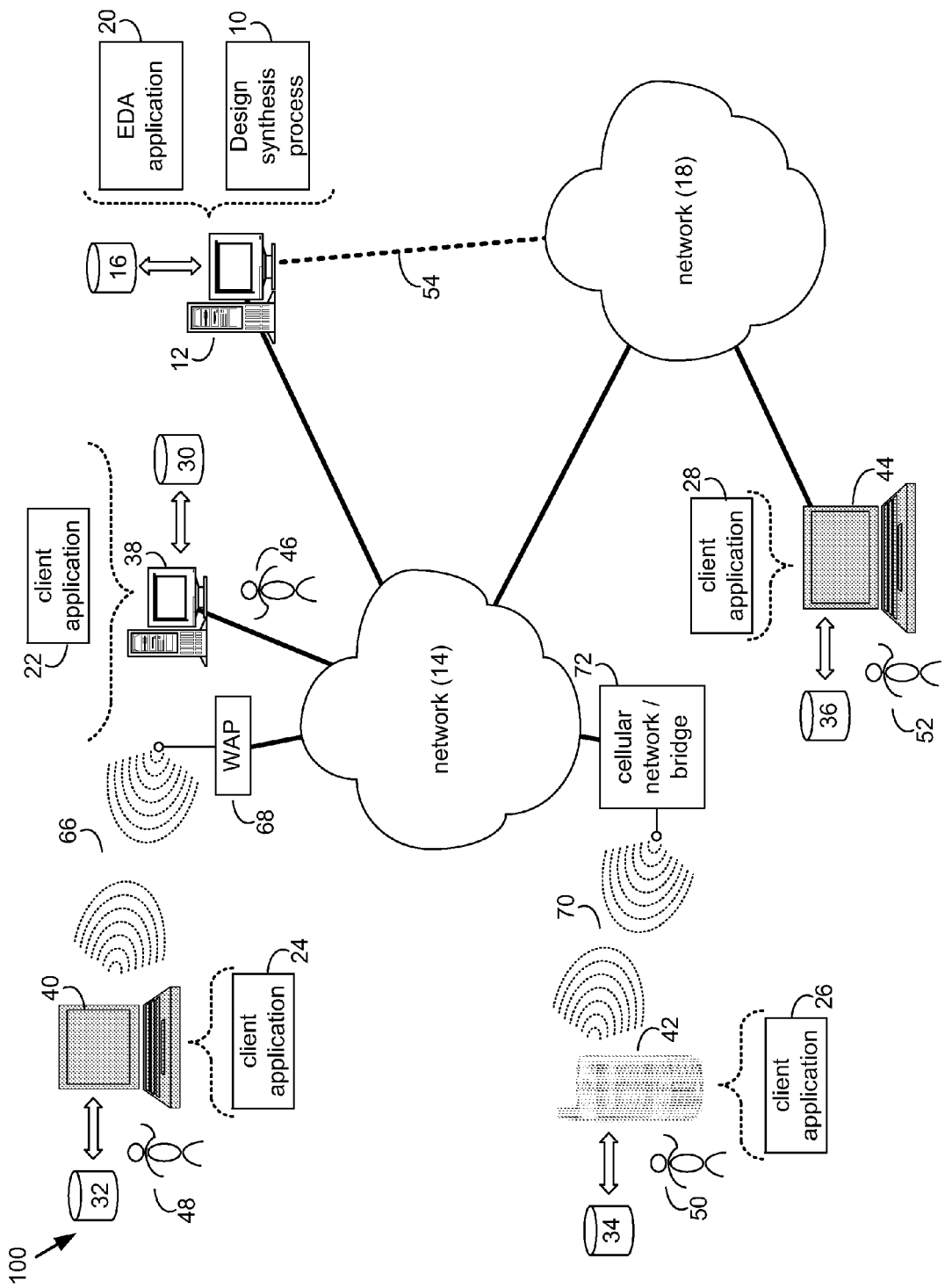
FIG. 1 is a system diagram depicting aspects of the design synthesis process in accordance with an embodiment of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, there is shown design synthesis process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the design synthesis process may reside on and be executed, in whole or in part, by a client electronic device, such as a personal computer, notebook computer, personal digital assistant, or the like.

As will be discussed below in greater detail, design synthesis process 10 may include a method for synthesis of device I/O associated with a printed circuit board (PCB) design. Design synthesis process 10 may be configured to generate a first programmable device model and a second programmable device model. Design synthesis process 10 may also be configured to determine one or more pin assignments associated with the first and second programmable device models based upon, at least in part, one or more of a breakout pattern and a fanout location, the one or more pin assignments configured to minimize one or more crossovers.

The instruction sets and subroutines of design synthesis process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design synthesis. EDA application 20 may be referred to herein as a design tool.

Design synthesis process 10 may be a stand alone application, or may be an applet/application/script that may interact with and/or be executed within EDA application 20. In addition/as an alternative to being a server-side process, the design synthesis process may be a client-side process (not shown) that may reside on a client electronic device (described below) and may interact with an EDA client application (e.g., one or more of EDA client applications 22, 24, 26, 28). Further, the design synthesis process may be a hybrid server-side/client-side process that may interact with EDA application 20 and an EDA client application (e.g., one or more of client applications 22, 24, 26, 28). As such, the design synthesis process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize design synthesis process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Figure 2:
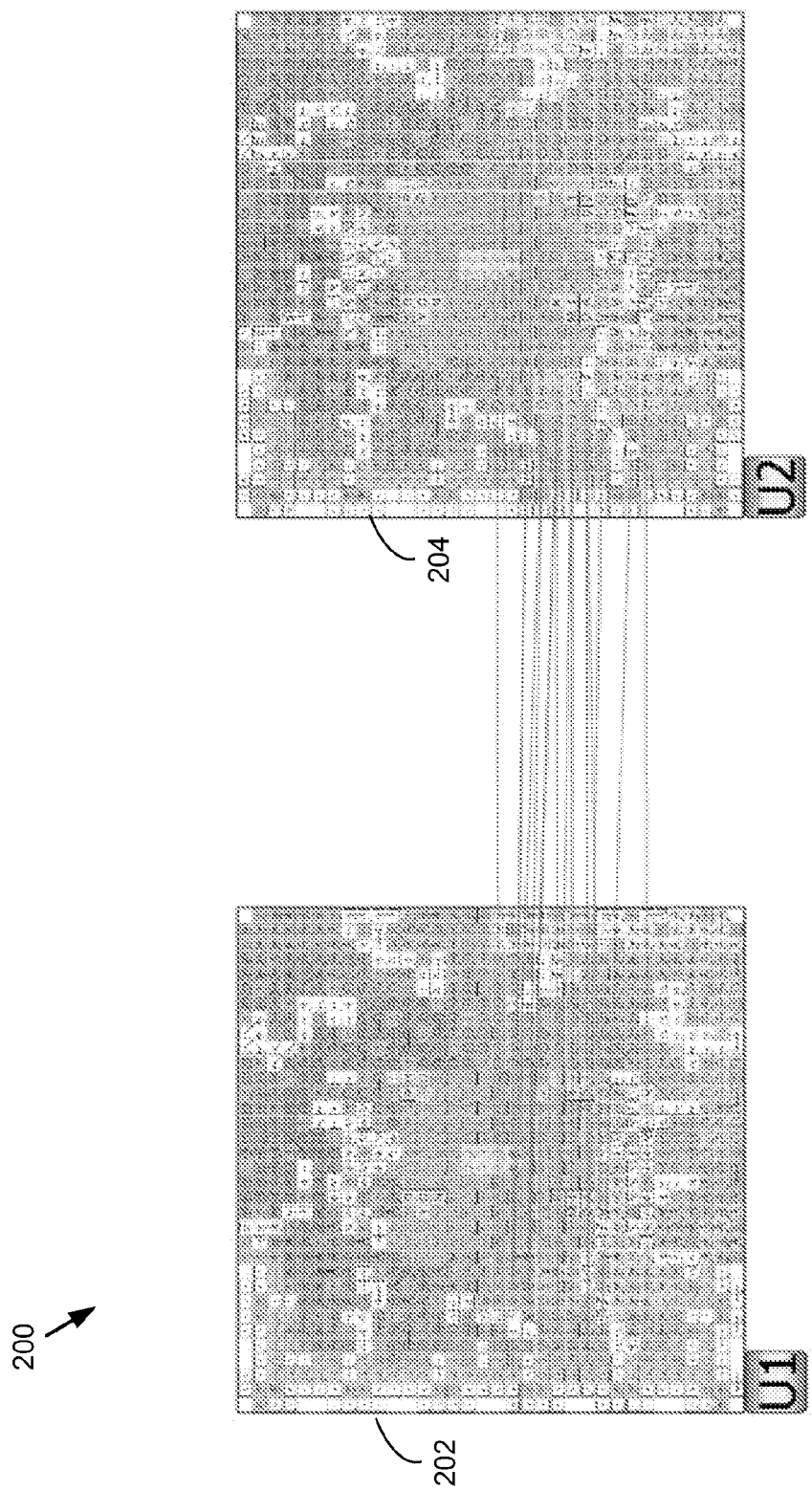
FIG. 2 is a diagram depicting device models of the design synthesis process in accordance with an embodiment of the present disclosure.

Referring now to FIG. 2, an embodiment of the present disclosure showing two device models 202, 204 (i.e., U1 and U2) is provided. The device models may be generated using one or more software tools. It should be noted that some or all of the device models described in this disclosure may be programmable device models. In some embodiments, the phrase "device model" may refer to an abstract representation of components (e.g., ICs, discrete parts, or anything else) that are to be mounted on to a PCB. The device model may represent different physical, logical and/or electrical aspects of the pins that are used to mount a component onto the PCB. Some aspects may include, but are not limited to, physical characteristics (e.g., location of the pin, orientation of the component, etc), electrical characteristics (e.g., i/o standard supported by the pin), and logical characteristics (e.g., whether the pin is a power supply pin or logic i/o pin).

As such, each programmable device model may correspond to an FPGA or similar device. The existing software tools may be used to perform placement aware synthesis in order to minimize crossovers on the rats nest. The design depicted in FIG. 2 may assign pins in such a way that the crossovers are minimized.

However, optimization of crossovers on the rats nest does not always guarantee an improvement in routing due to fanout and breakout directions/patterns, obstructions on the PCB, etc. In the example shown in FIG. 2, if the connected pins of both of the programmable device models breakout onto the left side of the respective ball grid arrays (BGAs), the rats based crossover minimization may lead to the scenario depicted in FIGS. 3-4.

Figure 3:
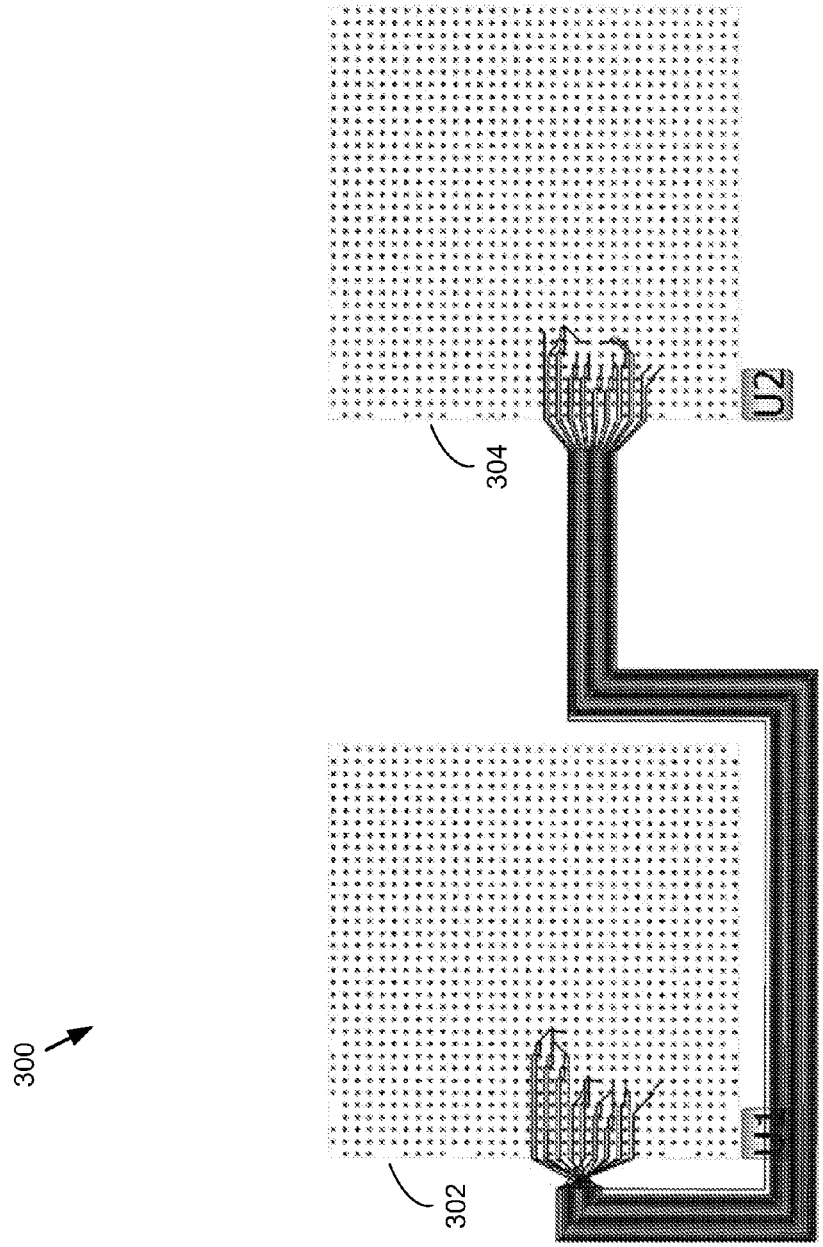
FIG. 3 is a diagram depicting device models of the design synthesis process in accordance with an embodiment of the present disclosure.
Figure 4:
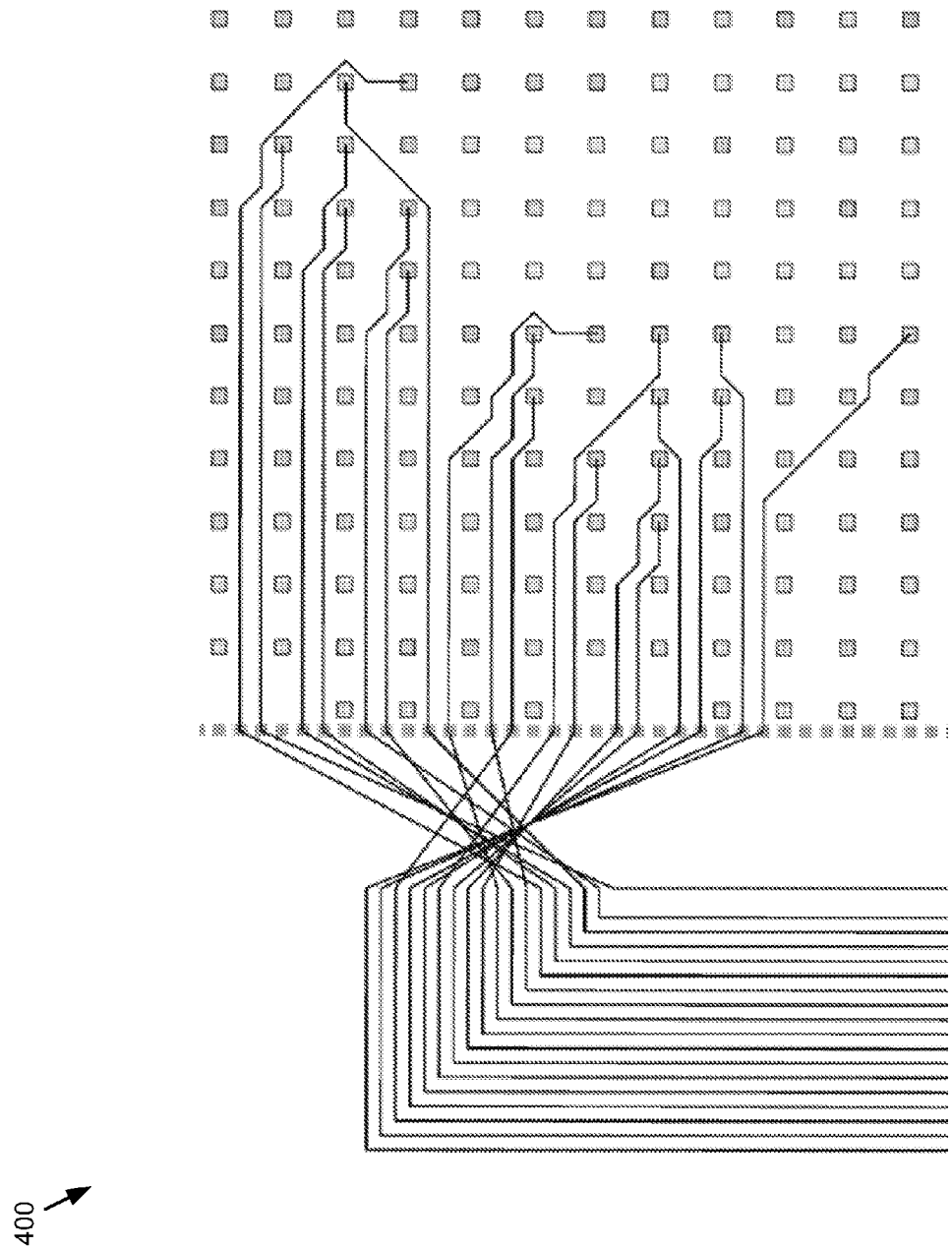
FIG. 4 is a diagram depicting device models of the design synthesis process in accordance with an embodiment of the present disclosure.

Therefore, lack of consideration to breakout/fanout patterns may lead to sub-optimal designs, inefficient use of design resources, and increased design iterations to achieve convergence. The existing approaches make pin assignments that satisfy the FPGA Design Rule Constraints (DRCs) and optimize the assignments in such a way that the length of the rats and the crossovers are minimized as shown in FIG. 2. Although this methodology may improve routability in terms of pin selection, it ignores the fact that a PCB will typically have more than one routing layer and that the number of crossovers on a particular routing layer of the board depends also on the breakout pattern of various components on the board. For improving the routability of the design, it is essential to consider these facts and then optimize the pin assignments to yield minimum crossovers to the breakout locations, to summarize, crossover minimization based on the existing rats nest approach may potentially deteriorate the routing crossovers as depicted in FIGS. 3-4. Many design parameters, such as breakout direction and the exact routing layer, are not considered in the initial optimization. This may result in a greater number of PCB layers, sub optimal routing and more design cycles to achieve convergence, etc.

In some embodiments, design synthesis process 10 of the present disclosure may address this problem by considering the breakout pattern and the layer on which the breakout is done. In this way, design synthesis process 10 may be used to improve the routability of the design, reduce the number of design iterations, and minimize PCB layer count.

In some embodiments, design synthesis process 10 of the present disclosure may consider layout information, e.g., breakout patterns, fanout locations, and assigned PCB layers to perform I/O optimization to minimize crossovers. In this way, design synthesis process 10 may significantly reduce the effort of the layout designer in routing the design and meeting the layer constraints.

For the purposes of the present disclosure, fanout of a pin may refer to a point at which a VIA is punched into the PCB to enable breakout of the pin on other layers of the PCB. In some embodiments, breakout of a pin of any electronic component may refer to the path or trace starting from the point of its contact to the PCB or from its fanout location to the periphery of the component. Any two nets, net segments or connections of the design are said to have a crossover when they cannot be routed on the same layer without causing a short or touching each other.

Figure 5:
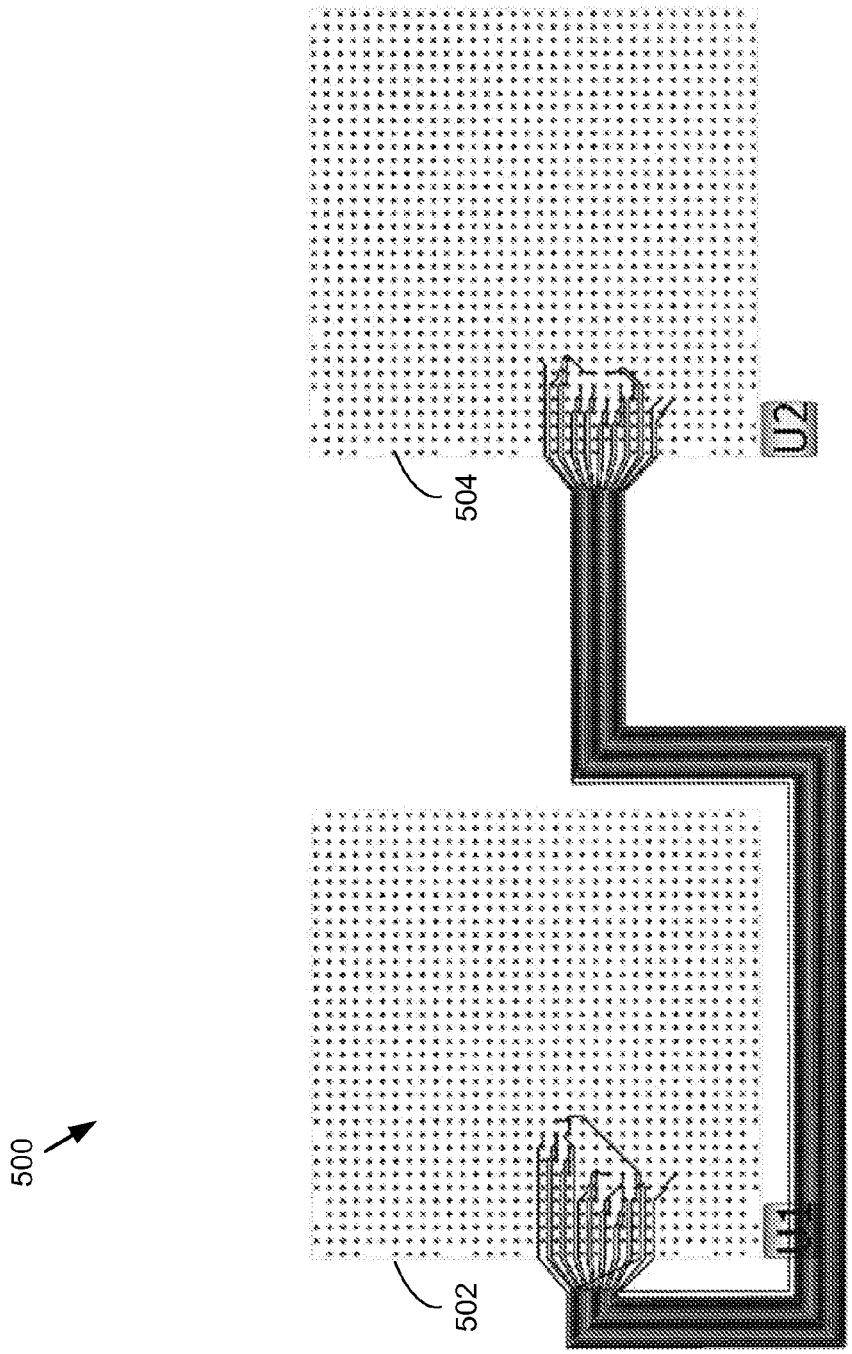
FIG. 5 is a diagram depicting device models of the design synthesis process in accordance with an embodiment of the present disclosure.
Figure 6:
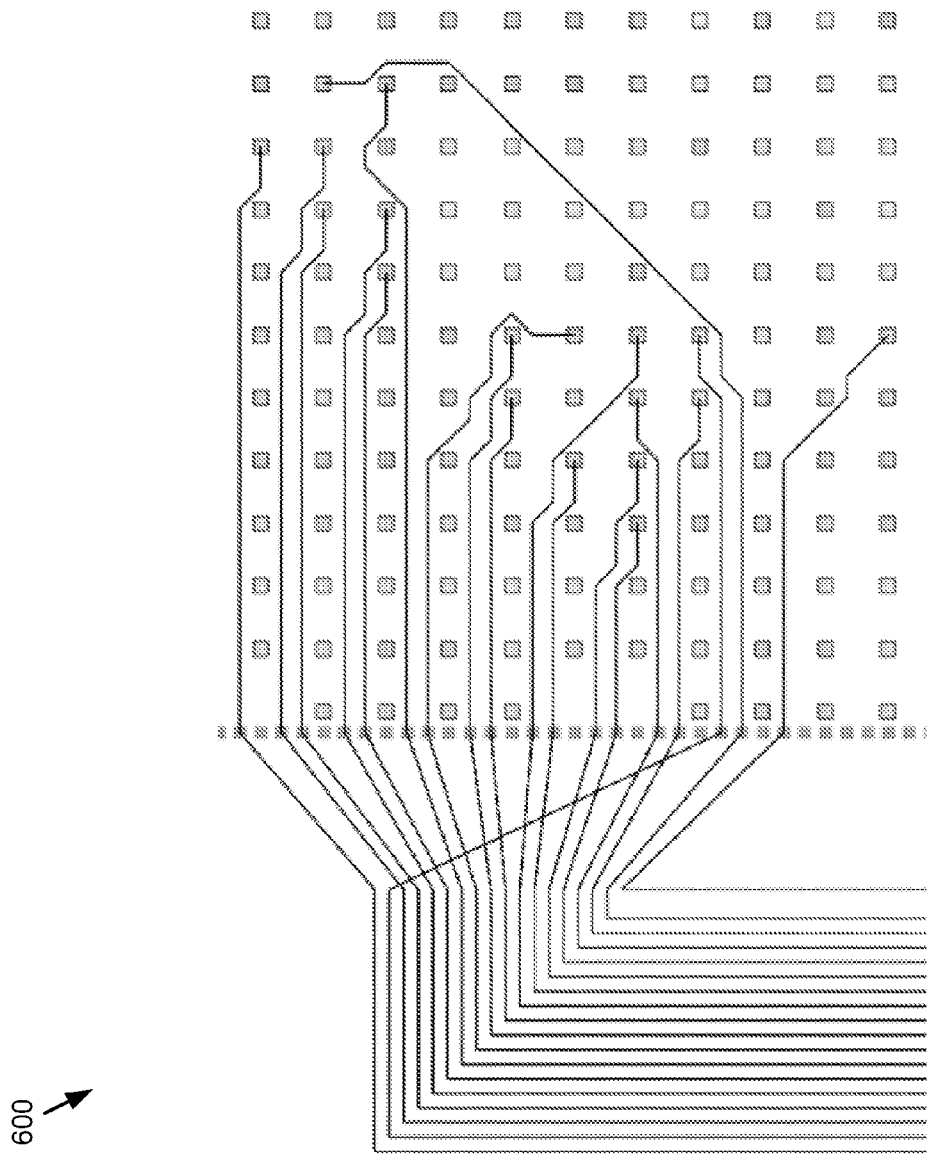
FIG. 6 is a diagram depicting device models of the design synthesis process in accordance with an embodiment of the present disclosure.

In some embodiments, design synthesis process 10 of the present disclosure may enable the designer to optimize the design considering the layout data right at the time of initial pin assignments. This may allow for the performance of quick design iterations that lead to an early convergence. FIGS. 5-6 depict the results of design synthesis process 10 on the same example shown in FIG. 3. FIG. 6 provides a close-up view of the crossover scenario after design synthesis process 10 has been applied.

Figure 7:
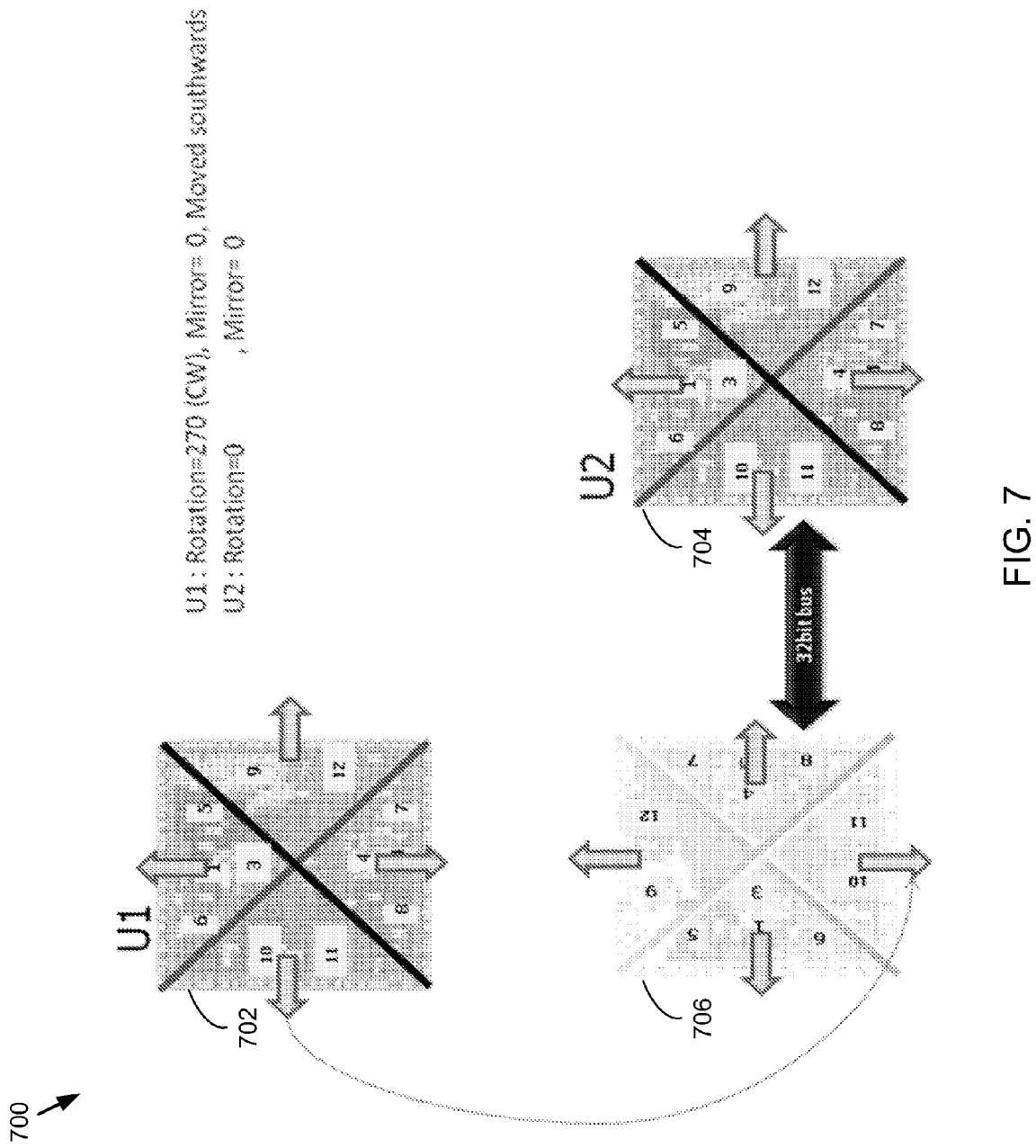
FIG. 7 is a diagram depicting device models of the design synthesis process in accordance with an embodiment of the present disclosure.

Referring now to FIG. 7, an embodiment of the present disclosure including diagram 700 illustrating a virtual rotation and shift approach is provided. The virtual rotate and shift technique may make initial rats assignments and rats optimization more router and breakout friendly by considering the breakout direction. In this way, the components to be connected may be virtually rotated and/or shifted to achieve the optimal pin allocation and to minimize crossovers. Diagram 700 includes two programmable devices 702 and 704 (e.g., FPGAs U1 and U2). The numbers annotated on these FPGAs correspond to each FPGA's associated banks. In operation, assume that a 32 bit bus has to be connected from bank 8 of U1 to bank 11 of U2. Applying the virtual rotation and shift technique, device U1 may be rotated 270 degrees clockwise and shifted down such that bank 8 of U1 and bank 11 of U2 face each other. The virtual location of U1 after rotation and shift is depicted in programmable device model 706 of FIG. 7.

In some embodiments, design synthesis process 10 of the present disclosure may be configured to provide automatic interconnect planning for a particular design. This may include, but is not limited to, auto-bundling of nets, automatic determination of ideal breakout directions, automatic assignment of PCB layers to bundles and automatic determination of a feasible minimum number of PCB layers based on the electrical information provided by the user. Some of these approaches are discussed in further detail below.

Figure 8:
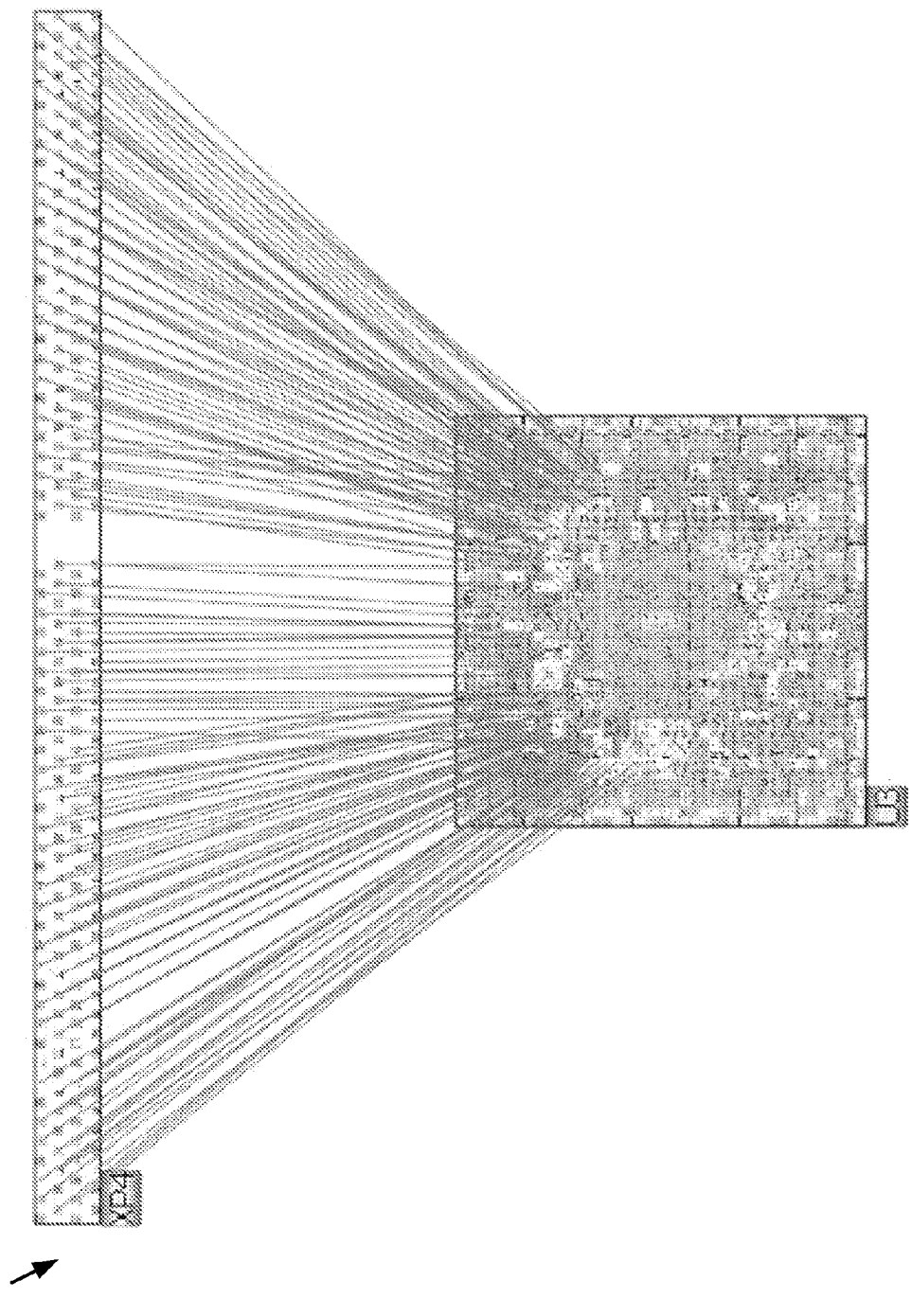
FIG. 8 is a diagram depicting device models of the design synthesis process in accordance with an embodiment of the present disclosure.

Referring now to FIG. 8, an embodiment of the present disclosure depicting diagram 800 is provided. Diagram 800 shows a double data rate (DDR2) dual in-line memory module (DIMM) connected to an FPGA. It should be noted that this example is merely provided for exemplary purposes as numerous other devices and configuration may be used without departing from the scope of the present disclosure.

In some embodiments, design synthesis process 10 of the present disclosure may be configured to provide auto-bundling of nets. These may be derived based upon their electrical and physical constraints, which may take into account, for example, swappability, the requirement to be routed on a single layer, routability of the bundle on a single layer, etc. Design synthesis process 10 may use information available in the design tool (e.g., FSP) logical model including but not limited to, grouping rules, signal associations and physical information like placement of components on the PC board to automatically bundle nets for interconnect planning. The auto-bundling described herein may also consider user defined requirements and constraints such as swappability, signal directions, IO standard based grouping layer restrictions, etc.

Figure 9:
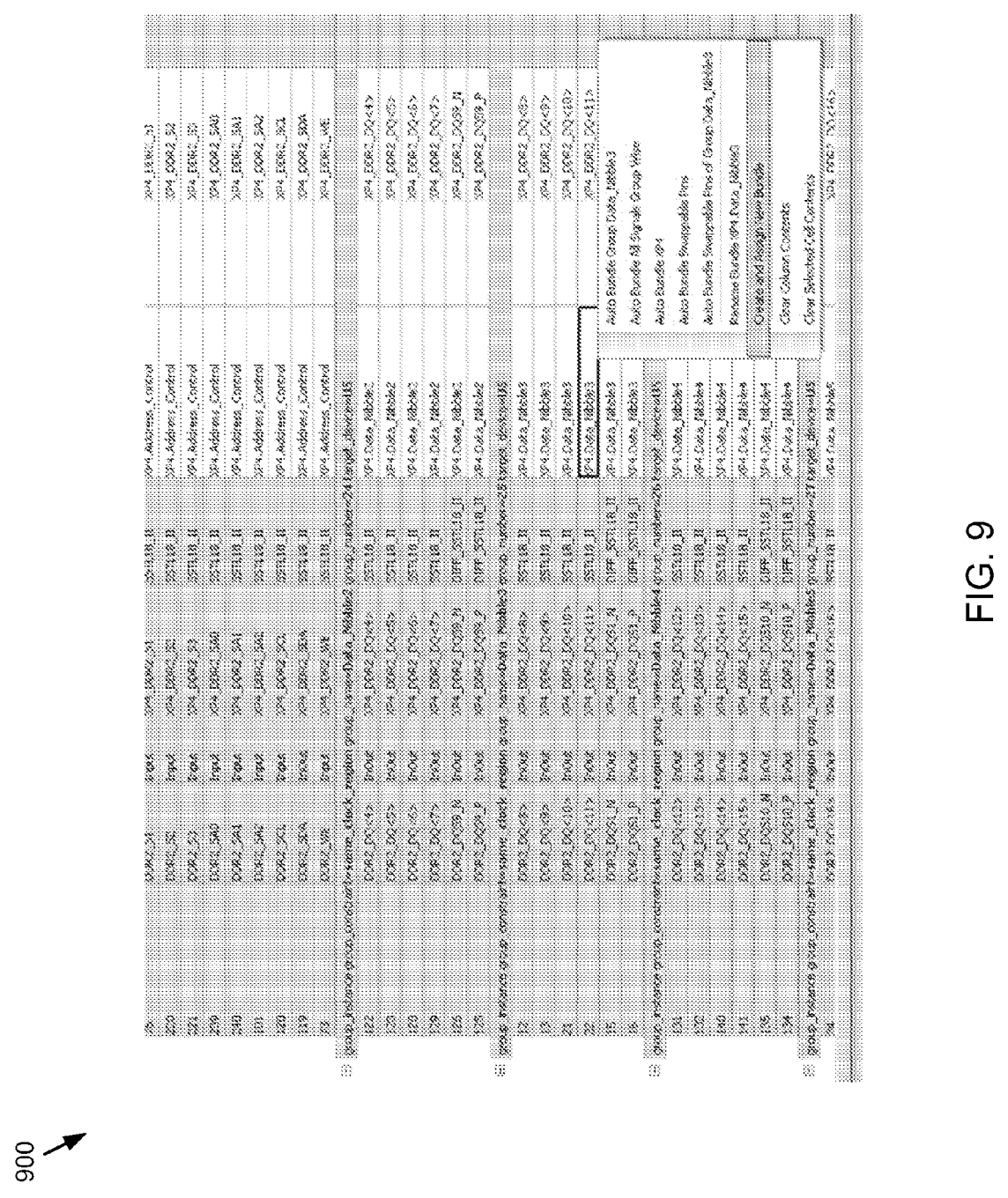

Referring now to FIG. 9, an embodiment of the present disclosure depicting diagram 900 is provided. Diagram 900 shows several auto-bundling options provided in the design tool (e.g. FSP) for the signals originating from the interface component XP4 shown in FIG. 8. Diagram 900 may include a menu configured to provide various options to the user on this menu. These options may assist the user in quickly defining and fine-tuning the bundle definitions based on the logical information already available in the design tool (e.g. FSP) model data. Some auto-bundling options may include, but are not limited to, "Auto Bundle <instance_name>": this option may bundle all signals of the interface or protocol into a single bundle. "Auto Bundle All Signals Group Wise": this option may bundle all signals into separate bundles on a per-group basis. For example, data and associated strobe signals may be routed together from any interface. This information may be directly derived from the FSP logical model with little or no user inputs. "Auto Bundle Swappable Pins": using this option the user may split the bundles derived out of the logical groups further to minimize crossovers based on the signal type. In the above example, strobe signals are generally routed to clock capable pins on the FPGA. Using this option may help avoid crossovers due to interleaving breakout pattern on a given layer. "Adaptive re-bundling based on routability": any large bundle which could not be routed on a single layer may be automatically split by FSP into smaller bundles until all the nets of the bundle are routed. For example, if a bundle consisting of 64 signals could not be routed on a single layer, it may be split into two 32 net bundles and so on.

In some embodiments, e.g., by default, auto-bundling of signals group wise may be performed at the time of instantiating interfaces components or defining protocols. This may help the user in quickly getting started with layer and breakout aware optimization with no additional inputs.

In some embodiments, the definitions need not be on the connected nets. Since the definitions may be captured on the originating pins of the signals targeted to the FPGA pins, these definitions may be retained during the successive pin assignment runs, i.e., the bundle definitions may be retained as the user is exploring different areas (e.g., banks) of the FPGA ball-grid array (BGA) for pin allocation.

Figure 10:
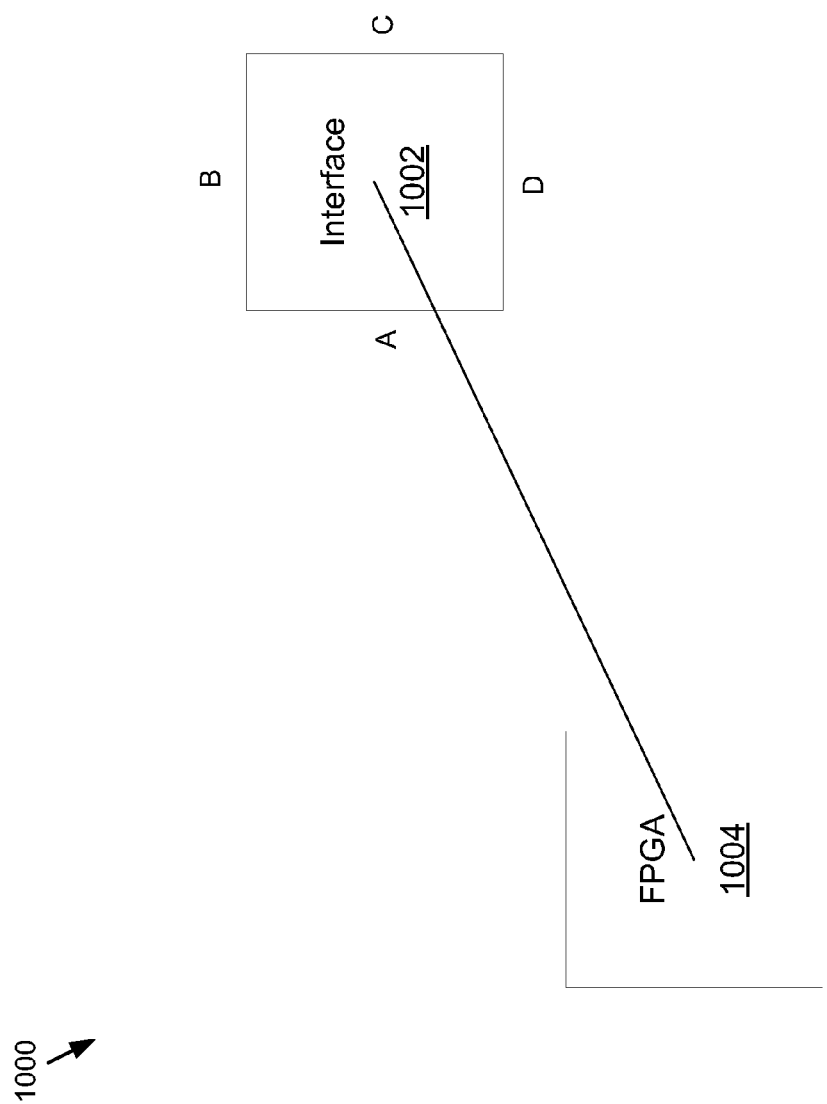
FIG. 10 is a diagram depicting aspects of the design synthesis process in accordance with an embodiment of the present disclosure.

Referring now to FIG. 10, an embodiment of the present disclosure depicting diagram 1000 is provided. In some embodiments, design synthesis process 10 may be configured to automatically determine breakout directions of bundles based on placement of the components on the board and the underlying pins. Design synthesis process 10 may be configured to determine breakout directions of bundles based upon, at least in part, a number of operations, which are described in further detail below.

In some embodiments, design synthesis process 10 may be configured to determine the optimal breakout direction of interface component pins. For example, and as shown in FIG. 10, a straight line may be drawn between the center of the interface 1002 and the center of the device 1004 to which it is connected. The side of the interface that overlaps with this line may be the ideal breakout direction for the interface. In case this side has a smaller length than its other sides, the adjacent side that is closest to the point of intersection may be used. In FIG. 10, side A of the interface is identified as its breakout direction.

Figure 11:
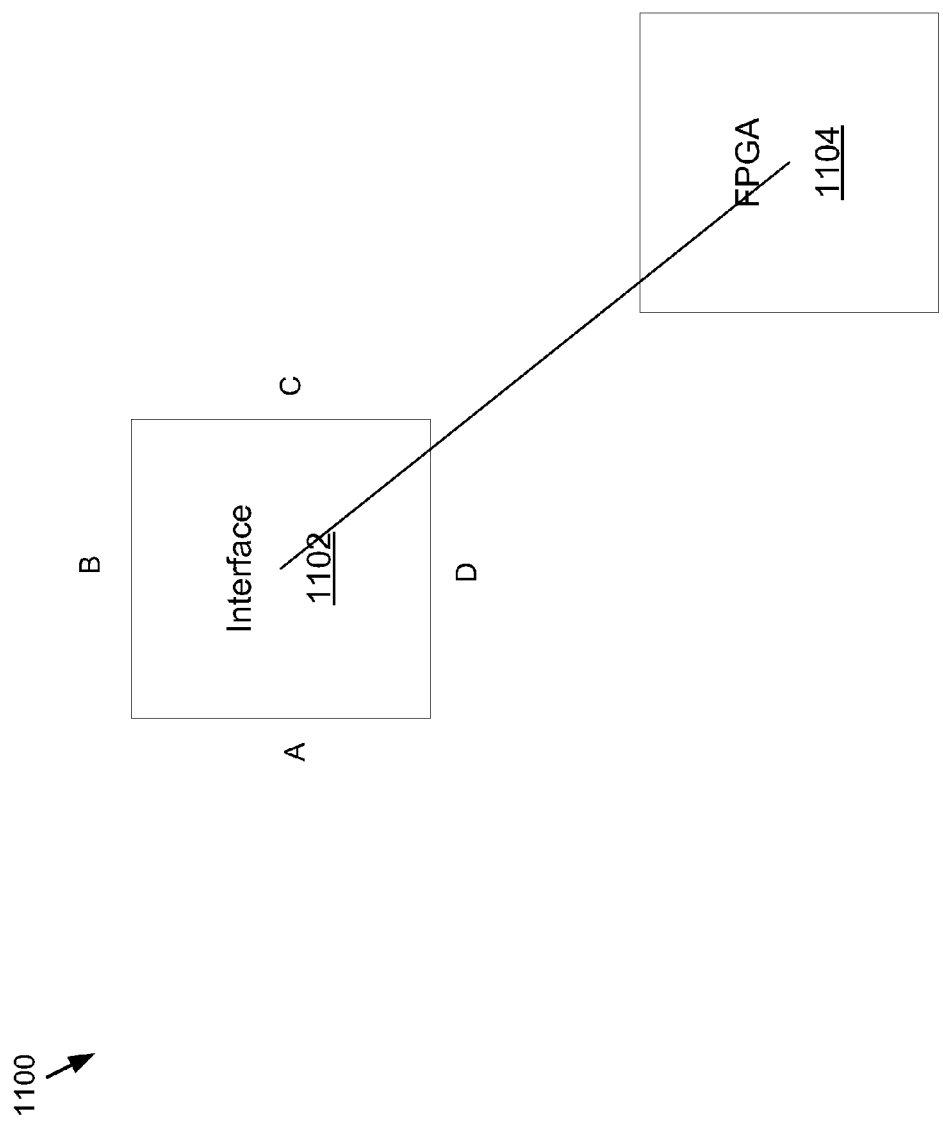
FIG. 11 is a diagram depicting aspects of the design synthesis process in accordance with an embodiment of the present disclosure.

Referring now to FIG. 11, an embodiment of the present disclosure depicting diagram 1100 is provided. Diagram 1100 depicts an interface 1102 and an FPGA 1104 as may be used in accordance with design synthesis process 10. For example, a straight line extended between the centers of the interface and the FPGA may cross side D. However, because D is a small side, side C is chosen as the ideal breakout direction as side C is nearer to the point of intersection than side A.

Figure 12:
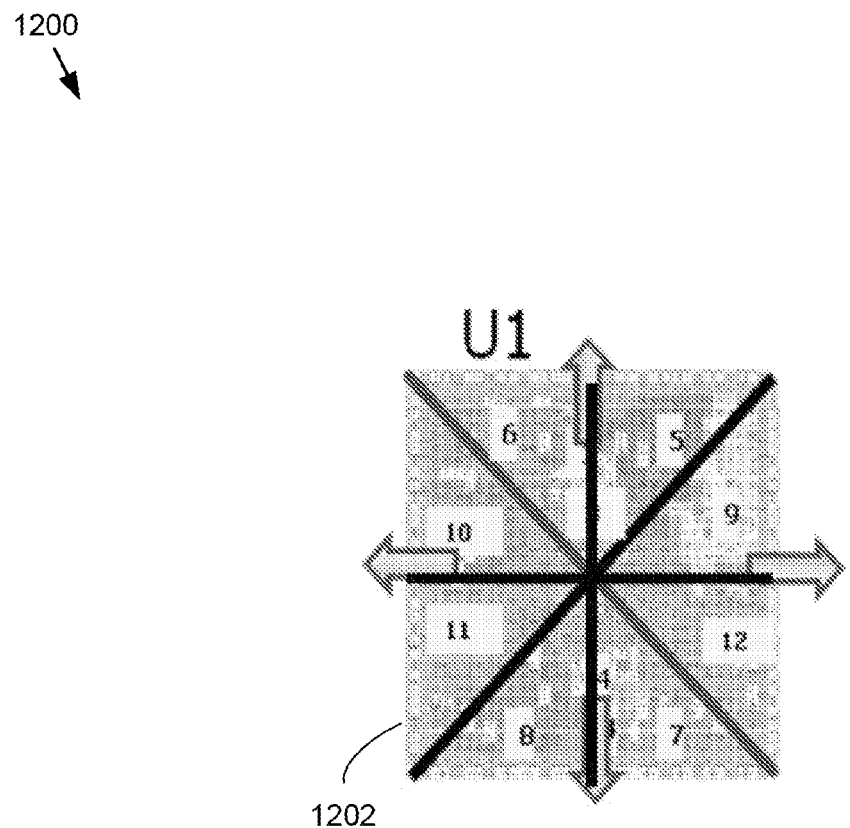
FIG. 12 is a diagram depicting aspects of the design synthesis process in accordance with an embodiment of the present disclosure.
Figure 13:
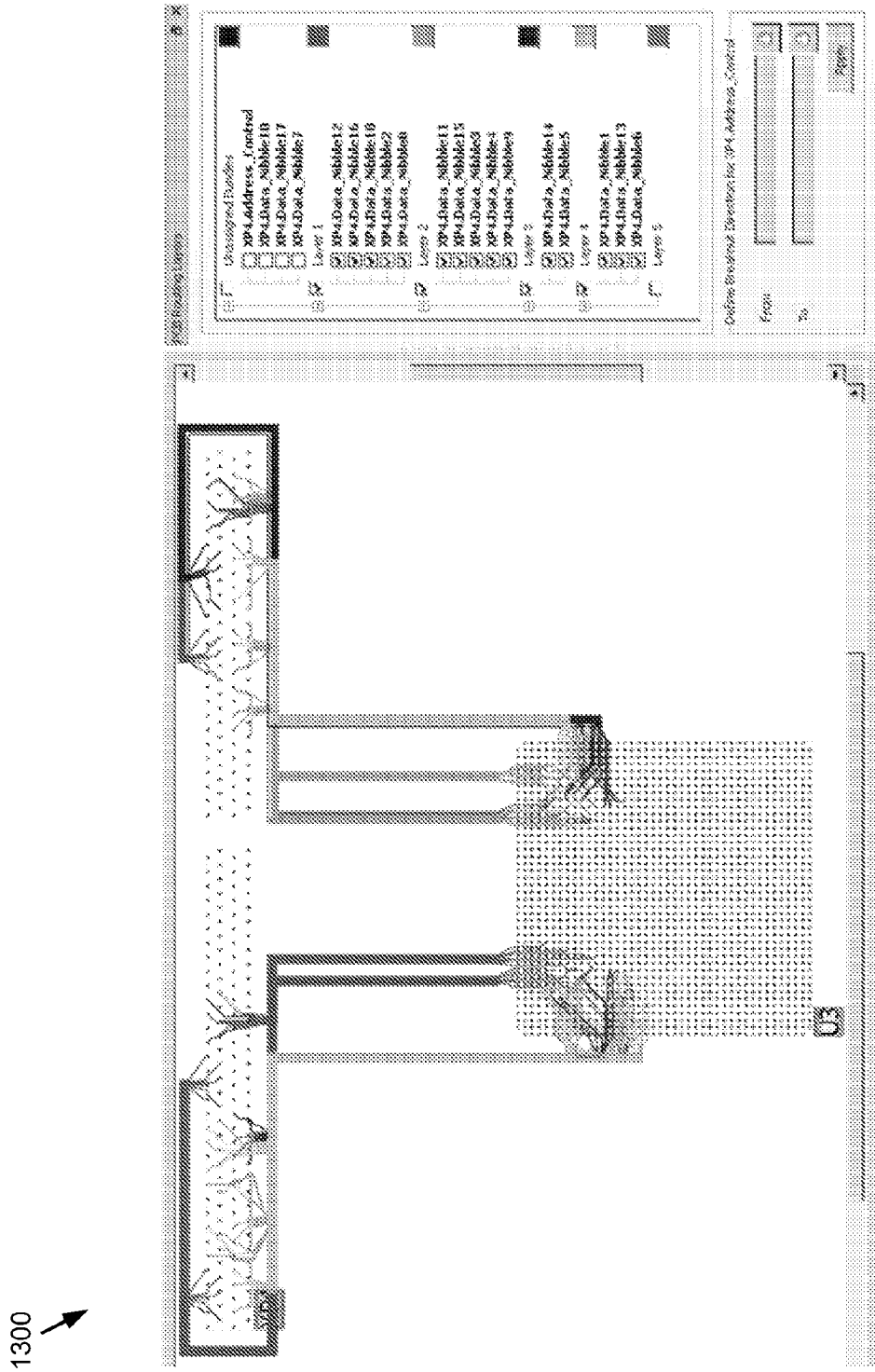
FIG. 13 is a diagram depicting aspects of the design synthesis process in accordance with an embodiment of the present disclosure.

Referring now to FIG. 12, an embodiment of the present disclosure depicting diagram 1200 is provided. Diagram 1200 depicts an exemplary FPGA 1202 divided into octants (e.g. 5-12). As discussed above, design synthesis process 10 may be configured to determine the breakout direction of pins on an FPGA or similar programmable device. Exemplary sample code that may be used to determine breakout direction is provided below:

1. Define occupiedOctantList with all the octants that are occupied by the bundle and the number of pins occupied in each octant.
2. Order occupiedOctantList in the descending order of the size of the occupied pins for each octant.
3. Define breakoutOctantList⇒ list of all octants in which the bundle has to breakout
4. Set currentOctant=pop(occupiedOctantList); previousOctant=NULL,
5. While currentOctant.size( )!=0
 1.1 if (previousOctant==NULL)
   breakoutOctantList.push_back(currentOctant) else if ((currentOctantsize( )>10% of noOfExitsPetOctant) && (previousOctant.size( )+currentOctant.size( )>noOfExitsPetOctant)) breakoutOctantList.push_back(currentOctant);
 1.2 previousOctant=currentOctant;
6. Merge the breakout octants of breakoutOctantList Referring now to FIG. 13, an embodiment of the present disclosure depicting diagram 1300 is provided. Diagram 1300 depicts a breakout view of the design shown in FIG. 8. In some embodiments, design synthesis process 10 may be configured to automatically assign bundles to PCB layers based on the obstructions and congestion on PCB layers. Using design synthesis process 10, the bundles may be automatically assigned to PCB layers using resource allocation techniques described below. Processing bundle by bundle, design synthesis process 10 may allocate a PCB layer to each bundle based on the possibility of breaking out the bundle on that layer. In this way, each bundle may be verified against the available PCB layers one after the other until a PCB layer is found where the bundle could be broken out or it is found that the bundle cannot be broken out on any layer. For the example shown in FIG. 8 the layer assignments for bundles that the design tool (e.g. FSP) has automatically determined are shown in FIG. 13. The bundles for which breakout aware optimization is done are depicted on the canvas as ribbons drawn from the breakout locations of their connecting pins. The colors of these ribbons indicate the layer that is assigned to them.

Figure 14:
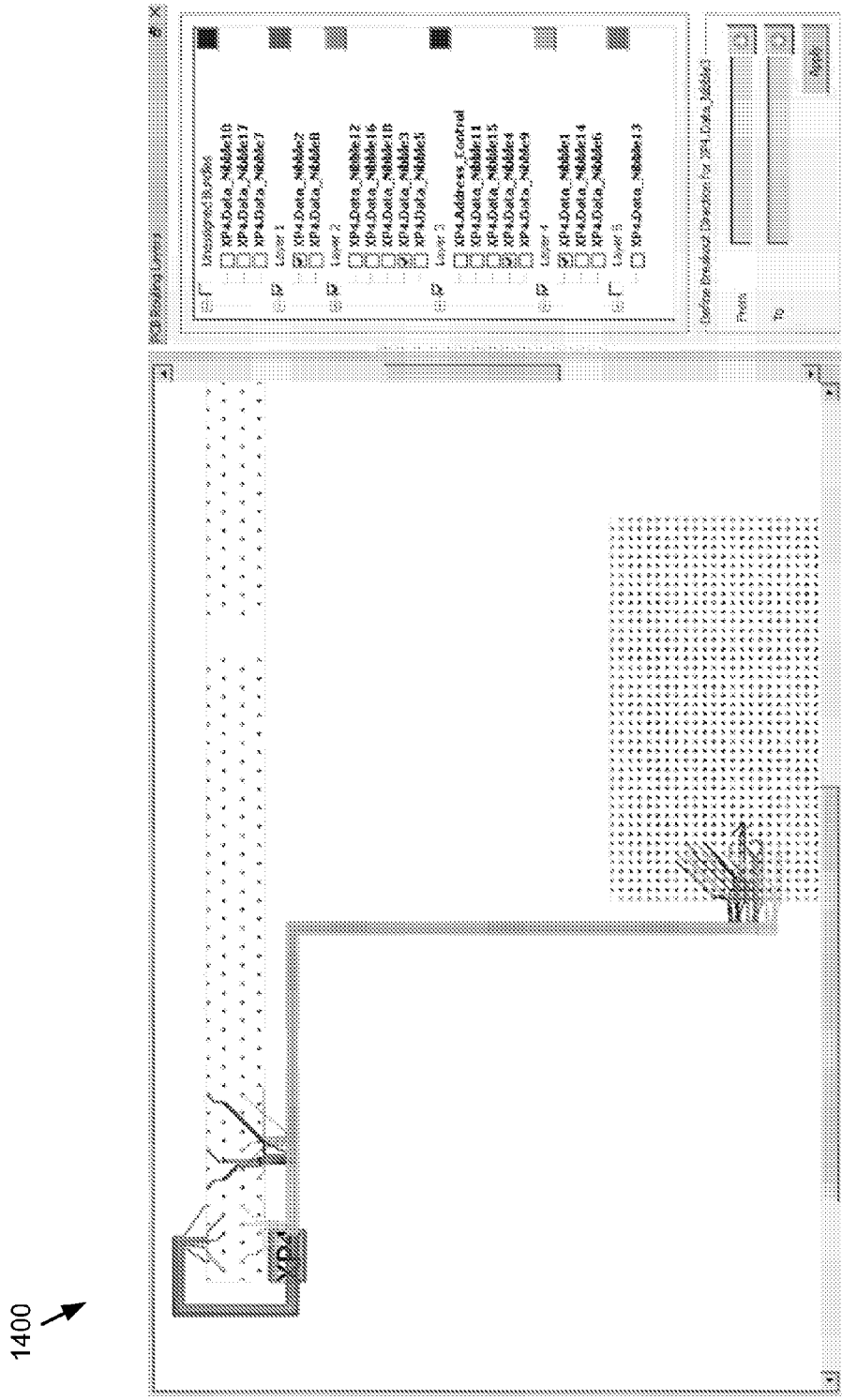
FIG. 14 is a diagram depicting aspects of the design synthesis process in accordance with an embodiment of the present disclosure.

Referring now to FIG. 14, an embodiment of the present disclosure depicting diagram 1400 is provided. Diagram 1400 depicts a breakout view of the design shown in FIGS. 8 and 13. Consider bundles XP4.Data_Nibble2, XP4.Data_Nibble3, XP4.Data_Nibble4 and XP4_Data_Nibble1 depicted in FIG. 14. These bundles have their pins assigned in the same region of the FPGA. Hence, it may not be possible to breakout all of these bundles on the same layer on the FPGA side. The design tool (e.g. FSP) may identify this and automatically assign them to different layers.

In some embodiments, design synthesis process 10 may include automatically determining a feasible and/or minimum number of layers on which a PCB can be routed. This may include the identification of a feasible minimum number of layers that the PCB requires to route all the bundles of the design. The heuristic used for this purpose may begin with a single PCB layer and may attempt to assign this layer to all of the bundles. If this is not possible due to the fact that the bundles cannot be broken out together as depicted in FIG. 14, it may iteratively add another layer until all the bundles are routed or it is identified that some of the bundles could not be routed. For the above example, it can be observed from the 'PCB Routing Layers' pane of the window shown in FIG. 13 that the tool has used four layers to breakout the bundles of the design. This may correspond to the feasible minimum number of layers that FSP has identified as required to route this design.

In some embodiments, design synthesis process 10 may be configured to performing initial pin assignment and optimization using a virtual rotate and shift approach. This approach may assist in making the initial pin assignments more appropriate and relevant to the routing intent of the user. The routing intent of the user may be captured in terms of the required rotation and shift that has to be made to one of the involved components in such a way that the pins to be connected face each other.

Figure 15:
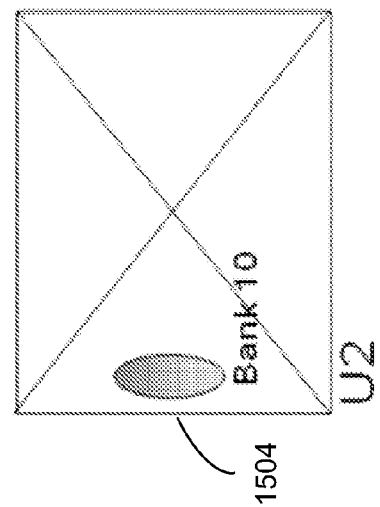
FIG. 15 is a diagram depicting aspects of the design synthesis process in accordance with an embodiment of the present disclosure.
Figure 15:
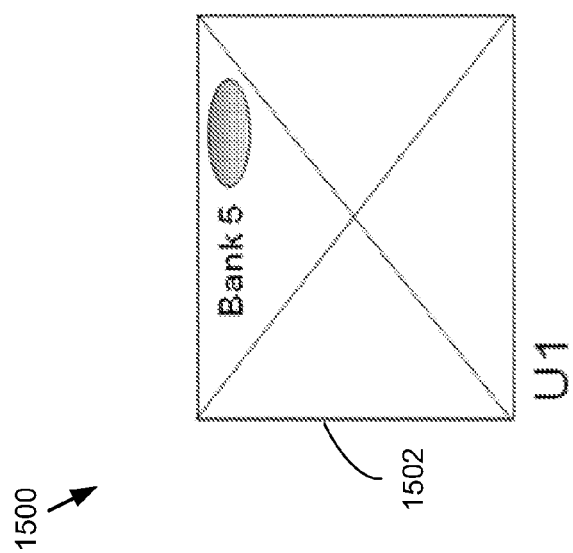
Figure 16:
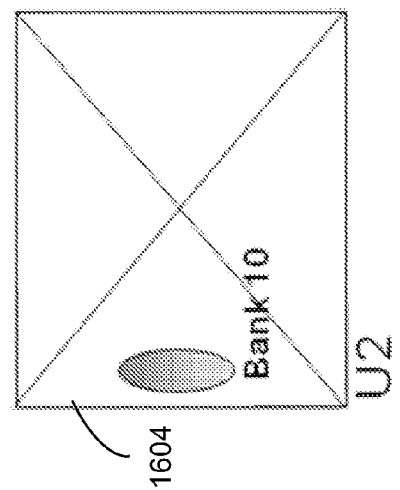
FIG. 16 is a diagram depicting aspects of the design synthesis process in accordance with an embodiment of the present disclosure.
Figure 16:
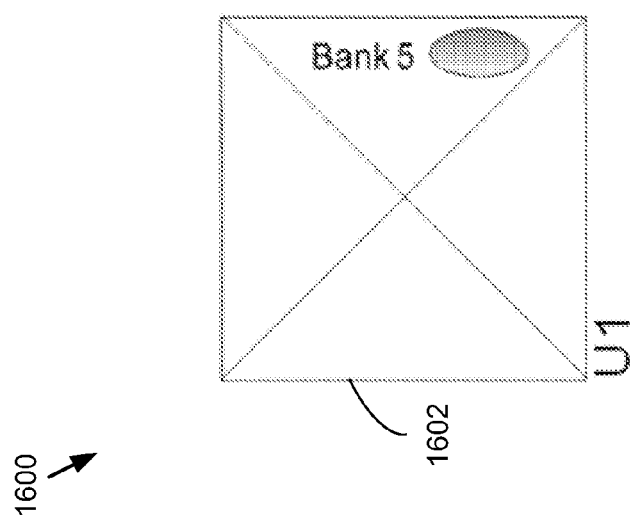
Figure 17:
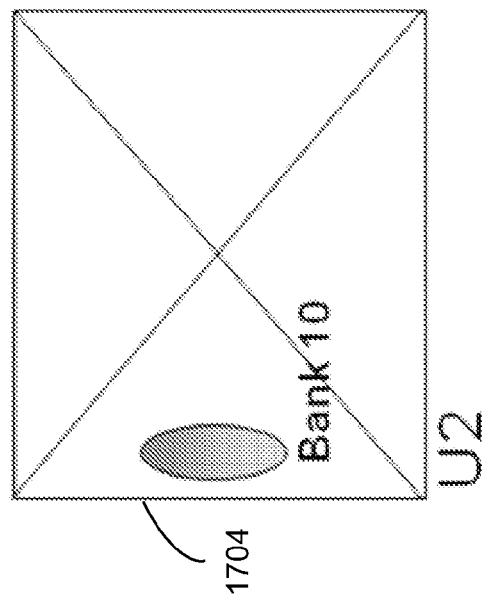
FIG. 17 is a diagram depicting aspects of the design synthesis process in accordance with an embodiment of the present disclosure.
Figure 17:
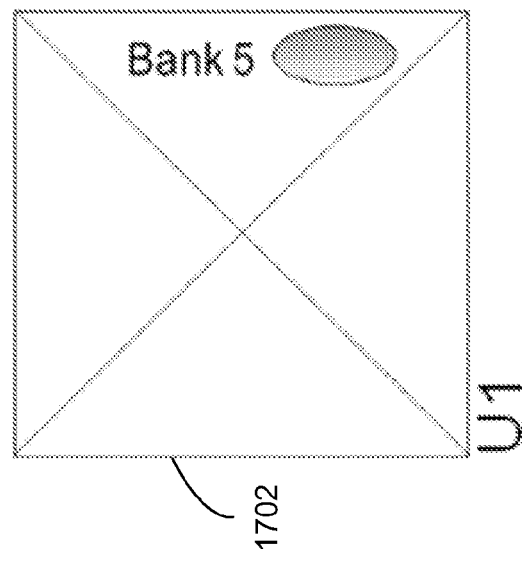
Figure 18:
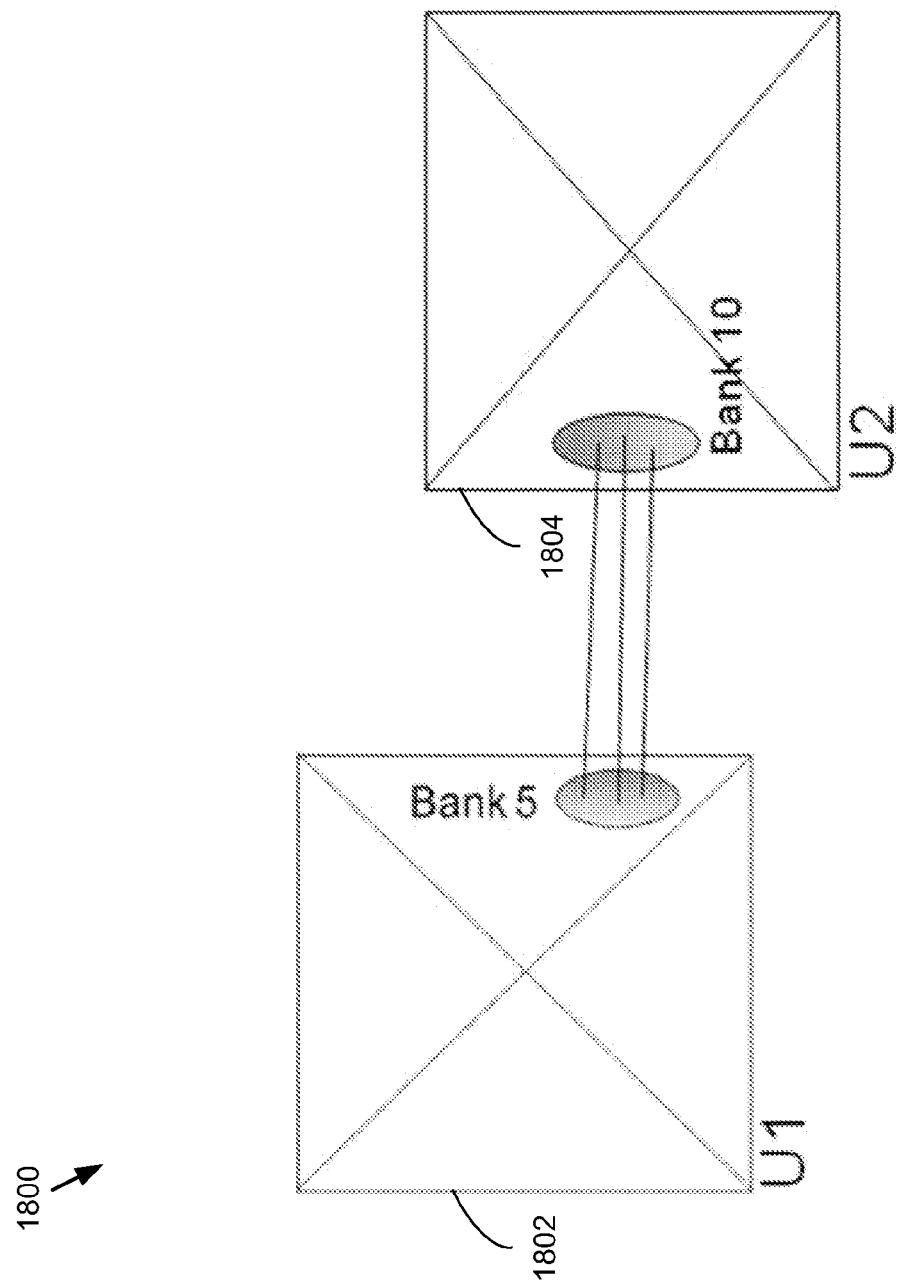
FIG. 18 is a diagram depicting aspects of the design synthesis process in accordance with an embodiment of the present disclosure.
Figure 19:
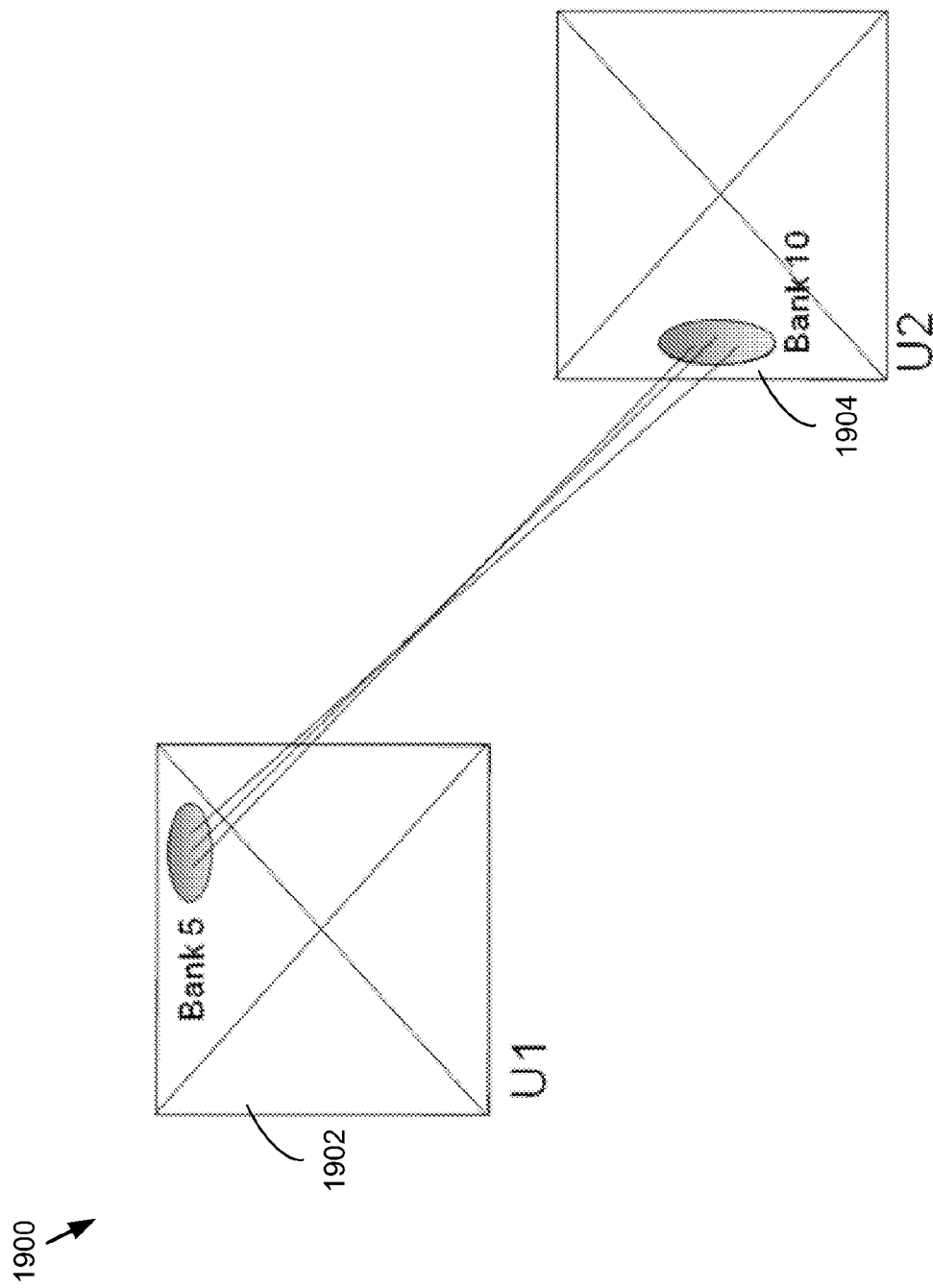
FIG. 19 is a diagram depicting aspects of the design synthesis process in accordance with an embodiment of the present disclosure.
Figure 20:
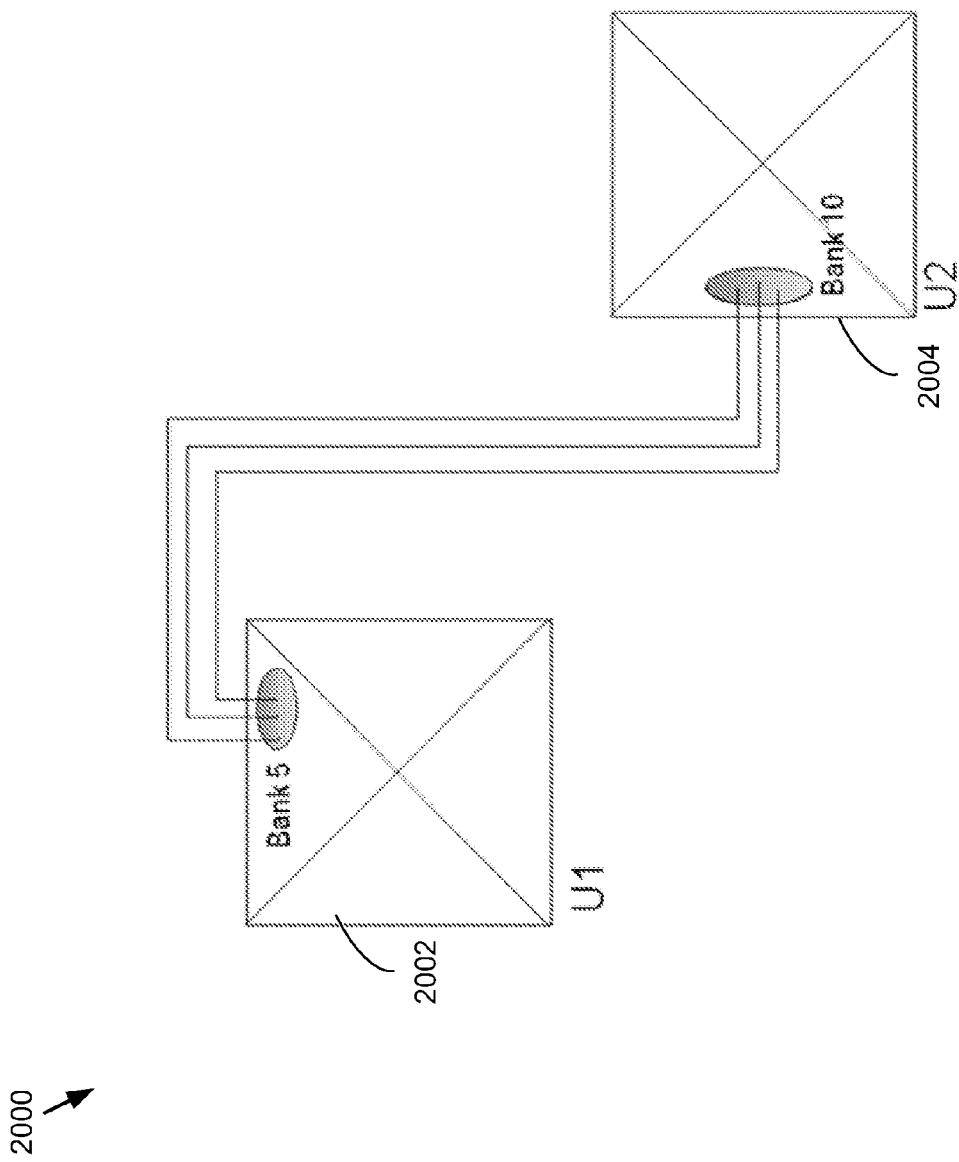
FIG. 20 is a diagram depicting aspects of the design synthesis process in accordance with an embodiment of the present disclosure.

Referring now to FIG. 15, an exemplary embodiment showing a diagram 1500 including two FPGAs 1502 (i.e. U1) and 1504 (i.e., U2) in which banks 5 and 10 have to be connected. Using the virtual rotate and shift technique it is identified that a clockwise rotation of 90 degrees may be required for instance U1, after which it appears as shown in FIG. 16. Instance U1 may then be shifted towards Bank 10 of instance U2 until the two banks to be connected face each other as shown in FIG. 17. Connections between the banks may be made considering the calculated virtual locations as shown in FIG. 18. FIG. 19 depicts the results after the connections have been made. Instance U1 is now moved back to its original location. It can be observed that the connections appear to have crossovers in their original locations, but they are indeed helpful at the time of actual routing as depicted in FIG. 20.

Figure 21:
FIG. 21 is a flowchart depicting operations consistent with the design optimization process of the present disclosure.
Figure 21:

Referring now to FIG. 21, an exemplary embodiment of design synthesis process 10 depicting operations 2100 consistent with the present disclosure is provided. Operations may include generating a first programmable device model and a second device model (2102). Operations may further include determining one or more pin assignments associated with the first programmable device model and the second device model based upon, at least in part, one or more of a breakout pattern, a breakout location, and a fanout location, the one or more pin assignments configured to minimize one or more crossovers (2104).

As discussed herein, design synthesis process 10 may be configured to perform a virtual rotation and shift of components on the PC board based on the intended/likely breakout directions of the set of signals that need to be synthesized. Design synthesis process 10 may be further configured to perform IO pin synthesis based on virtual locations of components and/or pins. Design synthesis process 10 may consider layout specific information like layers, breakout and fanout while performing I/O synthesis on components like FPGAs, connectors and packages to improve the routability of the design and ultimately minimize the number of layers. Design synthesis process 10 may include three-dimensional optimization techniques, e.g., consideration of layer information to determine IO pin assignments with minimal crossovers. Design synthesis process 10 may consider breakout and/or fanout pattern to determine IO pin assignments with minimal crossovers.

In some embodiments, design synthesis process 10 may be incorporated into an I/O optimization engine. The I/O optimization engine may be configured to address problems associated with both I/O synthesis and layout. For example, some I/O synthesis tools may not be able to determine router friendly pin assignments without having a breakout pattern and the layout tool may not produce optimal routing without router friendly pin assignments. The problem may be made even more complex as detailed routing and layout information may not available at the time of I/O pin assignments.

To address this situation, the I/O optimization engine may be designed in such a way that it may run with minimum required inputs when detailed and concrete physical information is not available, and also be configured to handle situations where the complete breakout and layer information is available. For example, early in the design cycle, when the user does not have detailed layout specific information in FSP or another design tool, the I/O optimization engine may default on most of the inputs (e.g., bundle definitions, breakout directions, layer assignments etc.) and may generate results based on these assumptions. Once concrete information on these inputs is available (either entered by user in the design tool (e.g. FSP) or imported from layout tool), the I/O optimization engine may re-optimize the pin assignments based on them. The I/O optimization engine may present a simple use model where the user needs to enter minimal input in the first pass where detailed layout information is not available. The flow of the I/O optimization engine may include one or more of the following operations. For example, initial pin assignments may be performed based on the virtual rotate and shift techniques described herein. The number of traces between BGA balls from the user may be collected. The user may optionally input the number of routing layers in the design (e.g., by default, it is automatic), define bundles and provide mapping on bundles. The I/O optimization engine may assign FPGA pins to connect to the interface components, and determine the rats nest based on these inputs and all other assumptions it makes by default. Further iterations may be made to achieve convergence by varying the initial inputs.

Embodiments of the present disclosure may be incorporated in whole or in part into any FPGA design tools. Leveraging the virtual interface and I/O synthesis capabilities of certain FPGA design tools, the IP generator pinouts may be optimized for routing on the PCB, thus bridging gap between RTL and layout. Moreover, it should be noted that although the methodology described above is focused on FPGAs, it can be applied also to connectors and packages.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for synthesis of device I/O associated with a printed circuit board (PCB) design comprising:

generating, using one or more processors, a first programmable device model and a second device model;

determining, using the one or more processors, one or more pin assignments associated with the first programmable device model and the second device model based upon, at least in part, one or more of a breakout location, and a fanout location, the one or more pin assignments configured to minimize one or more crossovers, wherein determining is based upon, at least in part, an assigned PCB layer and a three-dimensional optimization analysis;

automatically assigning one or more bundles of nets to a preferred PCB layer based upon, at least in part, an overall PCB layer congestion level and the three-dimensional optimization analysis, while minimizing the one or more crossovers; and performing a rotation and a shift of a virtual component on the PCB board based upon, at least in part, an expected breakout direction.

2. The computer-implemented method of claim 1, further comprising:

performing I/O synthesis based upon at least one virtual location, the at least one virtual location corresponding to at least one of a pin and a component.

3. The computer-implemented method of claim 1, further comprising:

automatic bundling one or more nets based upon, at least in part, at least one of an electrical constraint, a logical constraint, and a physical constraint.

4. The computer-implemented method of claim 1, further comprising:

automatically determining a breakout direction of a bundle based upon, at least in part, at least one of a component placement and a pin placement.

5. The computer-implemented method of claim 1, further comprising:

automatically determining one or more of a minimum number of layers and a feasible number of layers on which the PCB is routed.

6. A system for synthesis of device I/O associated with a printed circuit board (PCB) design comprising:

a computing device having at least one processor configured to generate a first programmable device model and a second device model, the at least one processor further configured to determine one or more pin assignments associated with the first programmable device model and the second device model based upon, at least in part, one or more of a breakout location, and a fanout location, the one or more pin assignments configured to minimize one or more crossovers, wherein the at least one processor is configured to determine based upon, at least in part, an assigned PCB layer and a three-dimensional optimization analysis, and wherein the at least one processor is configured to automatically assign one or more bundles of nets to a preferred PCB layer based upon, at least in part, an overall PCB layer congestion level and the three-dimensional optimization analysis, while minimizing the one or more crossovers, the at least one processor is configured to perform a rotation and a shift of a virtual component on the PCB board based upon, at least in part, an expected breakout direction.

7. The system of claim 6, wherein the at least one processor is configured to perform I/O synthesis based upon at least one virtual location, the at least one virtual location corresponding to at least one of a pin and a component.

8. The system of claim 6, wherein the at least one processor is configured to automatically bundle one or more nets based upon, at least in part, at least one of an electrical constraint, a logical constraint, and a physical constraint.

9. The system of claim 6, wherein the at least one processor is configured to automatically determine a breakout direction of a bundle based upon, at least in part, at least one of a component placement and a pin placement.

10. The system of claim 6, wherein the at least one processor is configured to automatically determine at least one of a minimum number of layers on which the PCB is routed and a feasible number of layers on which the PCB is routed.

11. A non-transitory computer-readable storage medium for synthesis of device I/O associated with a printed circuit board (PCB) design, the computer-readable storage medium having stored thereon instructions that when executed by a machine result in the following operations:

generating a first programmable device model and a second device model; and determining one or more pin assignments associated with the first programmable device model and the second device model based upon, at least in part, one or more of a breakout location, and a fanout location, the one or more pin assignments configured to minimize one or more crossovers, wherein determining is based upon, at least in part, an assigned PCB layer and a three-dimensional optimization analysis;

automatically assigning one or more bundles of nets to a preferred PCB layer based upon, at least in part, an overall PCB layer congestion level and the three-dimensional optimization analysis, while minimizing the one or more crossovers; and performing a rotation and a shift of a virtual component on the PCB board based upon, at least in part, an expected breakout direction.

12. The computer-readable storage medium of claim 11, wherein operations further comprise:

performing I/O synthesis based upon at least one virtual location, the at least one virtual location corresponding to at least one of a pin and a component.

13. The computer-readable storage medium of claim 11, wherein operations further comprise:

automatic bundling one or more nets based upon, at least in part, at least one of an electrical constraint, a logical constraint and a physical constraint.

14. The computer-readable storage medium of claim 11, wherein operations further comprise:

automatically determining a breakout direction of a bundle based upon, at least in part, at least one of a component placement and a pin placement.

15. The computer-readable storage medium of claim 11, wherein operations further comprise:

automatically determining at least one of a minimum number of layers on which the PCB is routed and a feasible number of layers on which the PCB is routed.

* * * * *